United States Patent [19]

Nishigaki et al.

[11] Patent Number: 4,644,406
[45] Date of Patent: Feb. 17, 1987

[54] LARGE SCALE CONTACT TYPE IMAGE READING UNIT USING TWO-DIMENSIONAL SENSOR ARRAY

[75] Inventors: Satoshi Nishigaki, Nara; Masataka Itoh, Tenri; Shohichi Katoh, Yamatokoriyama, all of Japan

[73] Assignee: Sharp Kabushiki Kaisha, Osaka, Japan

[21] Appl. No.: 696,089

[22] Filed: Jan. 29, 1985

[30] Foreign Application Priority Data

Feb. 1, 1984 [JP] Japan .................. 59-17885

[51] Int. Cl.[4] ........................................... H04P 3/14
[52] U.S. Cl. ................................. 358/213; 357/24
[58] Field of Search ............... 358/213, 212, 217; 357/24 LR; 250/211 J, 578

[56] References Cited

U.S. PATENT DOCUMENTS

| 4,032,903 | 6/1977 | Weimer . | |
|---|---|---|---|
| 4,185,293 | 1/1980 | Tihanyi | 357/32 |
| 4,271,420 | 6/1981 | Chikamura | 357/30 |
| 4,348,611 | 9/1982 | Ruppel et al. | 313/388 |
| 4,376,888 | 3/1983 | Fukada et al. | 250/211 J |
| 4,419,696 | 12/1983 | Hamano et al. | 358/294 |

Primary Examiner—Robert G. Lev
Attorney, Agent, or Firm—Birch, Stewart, Kolasch & Birch

[57] ABSTRACT

A two-dimensional image reading unit includes a semiconductor layer made of a photoelectric material having a pin structure, a plurality of transparent electrodes aligned parallel to each other and provided on one face of the semiconductor layer, and a plurality of opaque electrodes aligned parallel to each other and provided on the other face of the semiconductor layer such that the opaque electrodes intercept with the transparent electrodes. A photoelectric cell is defined at each crossing point of the transparent and opaque electrodes.

8 Claims, 12 Drawing Figures

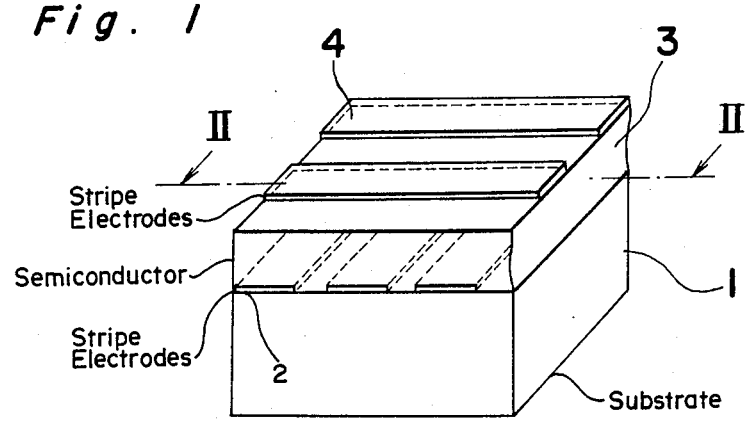
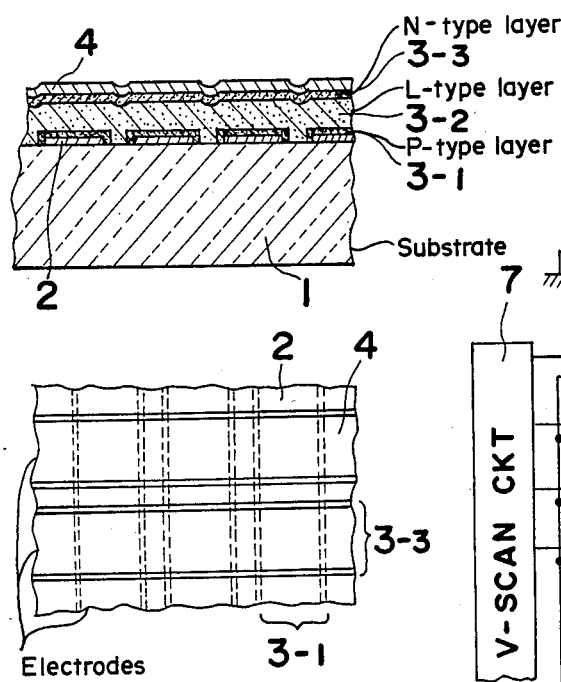
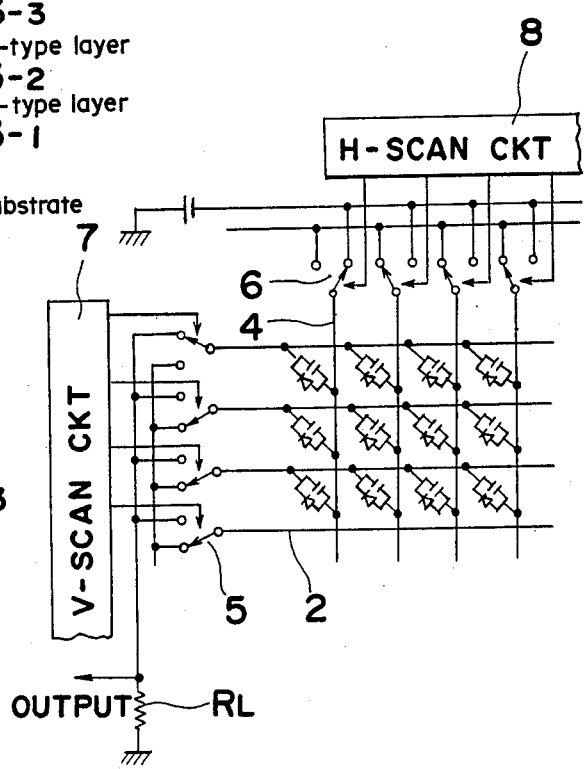

LARGE SCALE CONTACT TYPE IMAGE READING UNIT USING TWO-DIMENSIONAL SENSOR ARRAY

BACKGROUND OF THE INVENTION

1. Field of the invention

The present invention relates to a two-dimensional image reading device and, more particular, to an arrangement of a solid state imaging unit which can detect, without employing any mechanical or optical scanning arrangement, an image on a document which is placed directly on the imaging unit.

2. Description of the Prior Art

An image reading device is used in an apparatus, such as a facsimile machine or an intelligent copier. In the prior art image reading device, the document is read in a so-called slit scan method wherein the document is illuminated in a slit which is optically or mechanically scanned across the entire document. The slit image, which is usually reduced into a smaller size by a suitable optical lens system, is detected and read by the solid state imaging unit which is arranged in a one-dimensional layout, such that a plurality of imaging elements, such as CCDs or MOS type, are colinearly aligned.

A typical solid state imaging unit of prior art is about 30 millimeters long and, therefore, it is necessary to provide a relatively long optical path between the document where the slit image is produced and the imaging unit on which the slit image is reproduced. Accordingly, it has been very difficult to provide an image reading device of a compact size. Furthermore, in such a prior art image reading device, the adjustment in the optical system, such as a focusing adjustment, has been very difficult requiring a high skill. In addition, there are many other problems, such as a problem of insufficient light intensity in the peripheral portions and a problem of resolvability.

In order to overcome the problems described above, a so-called contact type of image reading device has been proposed. According to this device, a one-dimensional solid state image sensor is employed which can directly detect and read a slit image, without any reduction of the image, by a fiber lens array which extends between the document where the slit image is produced and the imaging unit. According to the contact type of image reading device, however, it is necessary to provide a photoelectric converting device of a relatively large size, requiring a formation of a photoconductive layer uniformly over a relatively wide area. At present, in order to form a one-dimensional solid state imaging unit of the contact type, it is proposed to use a CdS-CdSe layer, Se-As-Te amorphous layer or amorphous Si layer. In any case, to employ these layers to an image reading device, it is necessary to provide an arrangement to scan the document or to scan the optical lens system together with the imaging unit across the document, resulting in a bulky and sophisticated arrangement.

SUMMARY OF THE INVENTION

The present invention has been developed with a view to substantially solving the above described disadvantages and has for its essential object to provide an improved image reading device employing a two-dimensional solid state imaging unit which can detect and read the document image without using any mechanical or optical scanning arrangement.

It is also an essential object of the present invention to provide an improved image reading device employing a PIN structure in a photoelectric material, thereby improving the SN ratio and sensitivity of the two-dimensional solid state imaging unit.

In accomplishing these and other objects according to the present invention, a two-dimensional image reading unit comprises a layer made of a photoelectric material having opposite faces, a plurality of transparent electrodes aligned parallel to each other and deposited on one face of the layer, and a plurality of opaque electrodes aligned parallel to each other and deposited on the other face of the layer such that the opaque electrodes intercept with the transparent electrodes. A photoelectric cell is defined at each crossing point of the transparent and opaque electrodes.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIG. 1 is a fragmentary perspective view of a two-dimensional solid state image reading unit, particularly showing a photoelectric material structure, employed in an image reading device according to a preferred embodiment of the present invention;

FIG. 2a is a cross sectional view taken along a line II—II shown in FIG. 1;

FIG. 2b is a top plan view of the two-dimensional solid state image reading unit of FIG. 1;

FIG. 3 is a circuit diagram, particularly showing a drive circuit employed for driving the photoelectric cells employed in the two-dimensional solid state image reading unit of FIG. 1;

FIG. 9 is a cross sectional view of two-dimensional solid state image reading unit, particularly showing another embodiment of that shown in FIG. 2a.

DESCRIPTION OF THE PREFERRED EMBODIMENTS

Figure 4:
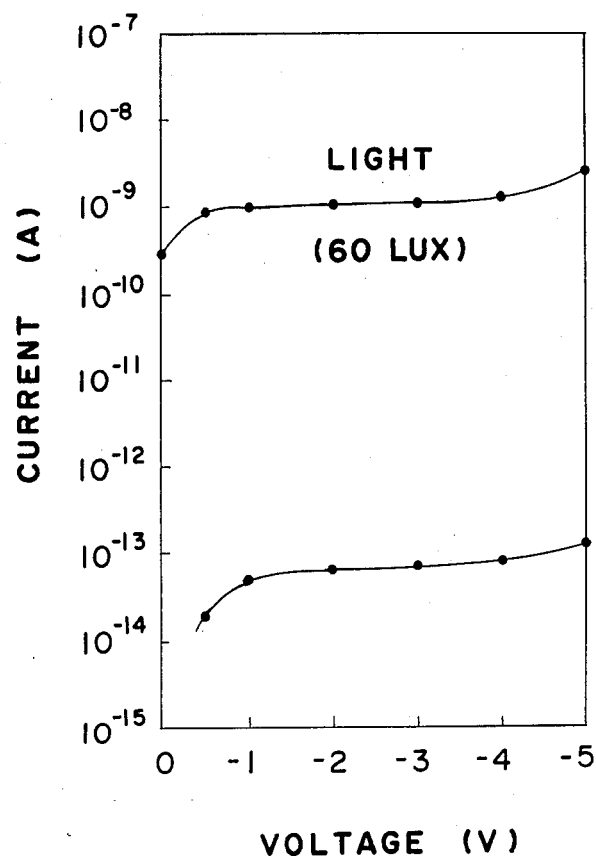
FIGS. 4, 5, 6 and 7 are graphs showing various operation characteristics of the two-dimensional solid state image reading unit.

Referring to FIGS. 1, 2a and 2b, fragmentary view of a two-dimensional solid state image reading unit is shown in an enlarged scale. The two-dimensional solid state image reading unit comprises a substrate 1 made of an electrically insulating material, a plurality of stripe electrodes 2 aligned in parallel with each other with a predetermined spacing, a semiconductor layer 3, and a plurality of stripe electrodes 4 aligned parallelly to each other with a predetermined spacing. Stripe electrodes 2, which will be also referred to as X electrodes, and stripe electrodes 4, which will be also referred to as Y electrodes, are provided on the opposite faces of semiconductor layer 3, and they extend perpendicularly to each other. According to a preferred embodiment, the semiconductor layer 3 is formed by a photoelectric material, such as a hydrogenated amorphous silicon with a PIN structure. At each crossing point of an X electrode and a Y electrode, a photoelectric cell is defined.

When the image reading unit is a type that receives an image on the surface of semiconductor layer 3 mounted with stripe electrodes 2, it is necessary to form the substrate 1 and the stripe electrodes 2 of transparent materials and to form the stripe electrodes 4 of a non-transparent material. In this case, it is preferable to form the transparent substrate 1 with a glass plate and the transparent stripe electrodes 2 with indium oxide ($In_2O_3$), tin oxide ($SnO_2$) or indium-tin oxide (ITO). And, the non-transparent stripe electrodes 4 whould preferable be formed with a film made of Al, Cr, Pt, In, In-Sn alloy, In-Ga alloy or Ni-Cr alloy.

On the contrary, when the image reading unit is a type that receives an image on the surface of semiconductor layer 3 mounted with the stripe electrodes 4, it is necessary to form the stripe electrodes 4 with a transparent material, and stripe electrodes 2 and substrate 1 with non-transparent materials. In this case, it is preferable to form the non-transparent substrate 1 with a ceramic plate and the non-transparent electrodes 2 with a film made of Al, Cr, Pt, In, In-Sn alloy, In-Ga alloy or Ni-Cr alloy. In this case it is preferable to form the transparent electrodes 4 with indium oxide ($In_2O_3$), tin oxide ($SnO_2$) or indium-tin oxide (ITO).

Referring to FIG. 3, an equivalent circuit of the image reading unit is shown together with a driving circuit for driving the photoelectric cells. The X electrodes 2 are connected to a plurality of switching elements 5. Similarly, the Y electrodes 4 are connected to a plurality of switching elements 6. Each switching element is formed, for example, by a C-MOS transistor having its gate connected to a shift register. By the control signals supplied from vertical and horizontal scan circuits 7 and 8, on and off operation of each photoelectric cell is controlled.

Figure 5:
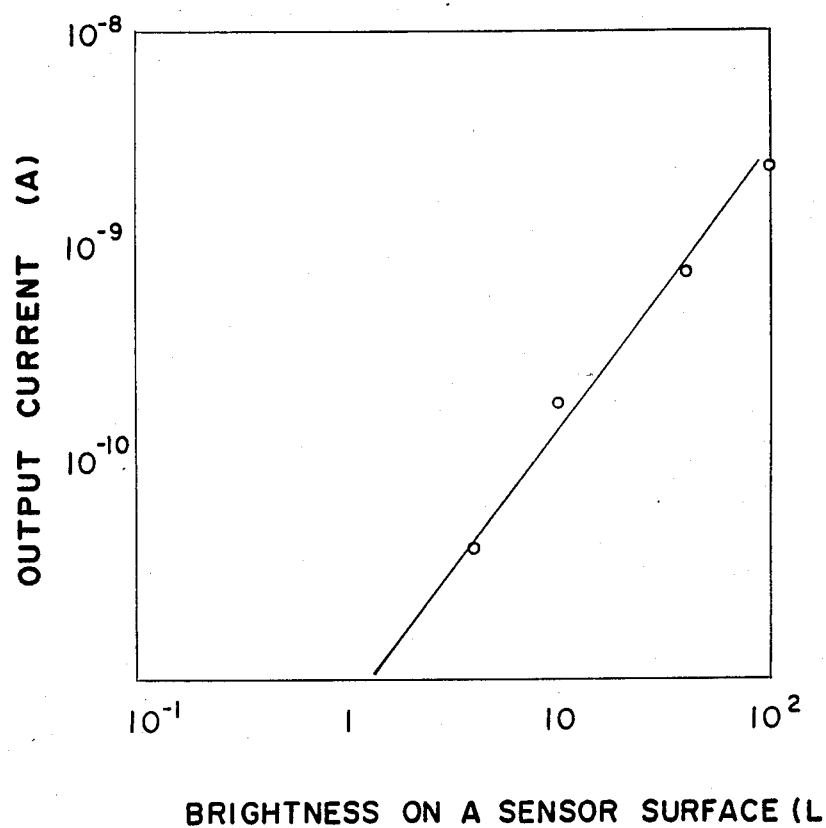
Figure 6:
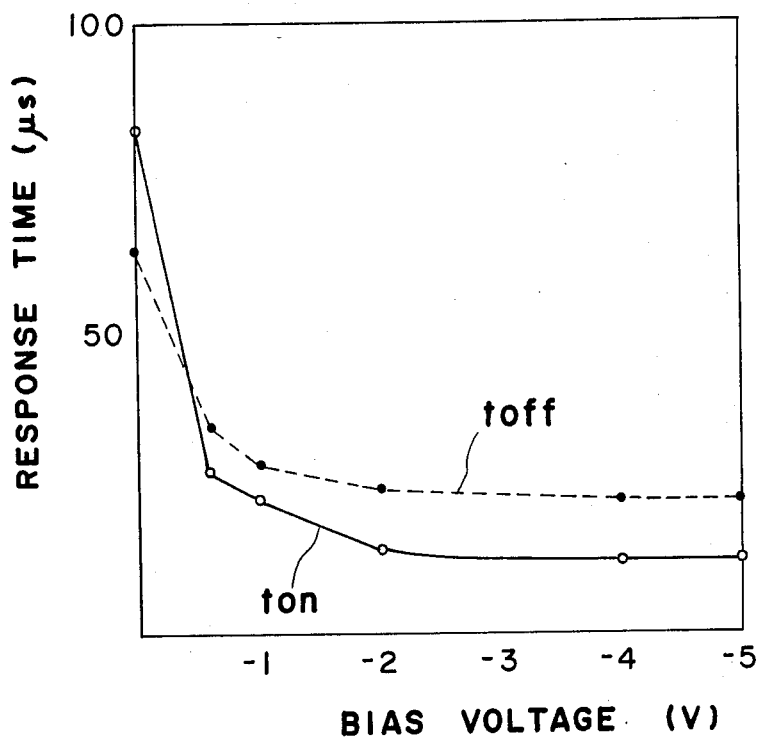
Figure 7:
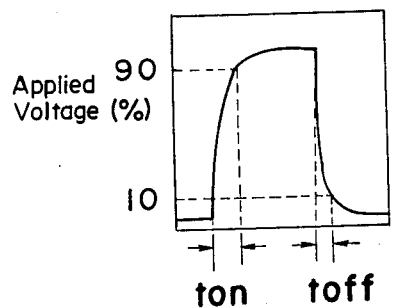

The various characteristics of the photoelectric cell is shown in the graphs of FIGS. 4–7. Specifically, FIG. 4 shows a voltage-current characteristics; FIG. 5 shows the photocurrent illumination intensity characteristics; FIG. 6 shows the on and off response times different reverse bias voltages; and FIG. 7 shows definitions of response times $t_{on}$ and $t_{off}$ used in the graph of FIG. 6. As understood from these graphs, the photoelectric cell can operate at a low voltage, such as below 5 volts and yet obtaining a distinctive difference between the current in the dark and under illumination (static characteristic), for example a ratio of $10^4$–$10^5$. Furthermore, the response time for both rise (90%) and decay (10%) is very short, such as below 50 microseconds.

Since the photoelectric cell is defined by hydrogenated amorphous silicon, the intrinsic volume resistivity of the p-layer or n-layer is relatively low, resulting in an undesirable leakage current between neighboring photoelectric cells. In order to prevent the photoelectric cells from producing such a leak current, it is preferably to process the hydrogenated amorphous silicon so as to divide p-layer and n-layer into a pattern having the same configuration as the X and Y electrodes through the etching steps. Such an etching hardly influences the other characteristics of the photoelectric cells. The layer provided on the side which receives light should preferably be very thin, such as 50–1000 Å, so as to prevent the loss of light intensity in the layer. Also, to avoid the defect of a pin hole and to prevent any intrusion of current, the i-layer has a thickness between 0.5 and 5 micrometers, and preferably between 1–3 micrometers with a volume resistivity greater than $10^7$ ohm-centimeters, preferably $10^9$ ohm-centimeters. Various embodiments are described below.

EMBODIMENT 1

Substrate 1 is formed by a Pyrex glass (140×70) having a thickness of 1.1 millimeters. A thin film of aluminum 2, having a thickness about 2000 Å, is evaporated on substrate 1 and, thereafter, a p-type amorphous silicon layer 3-1 (FIG. 2), having a thickness about 1000 Å, is deposited on aluminum layer 2 through the step of plasma CVD. Then, through a known photolithographic process, the aluminum layer 2 and p-type amorphous silicon layer 3-1 are etched together to form a plurality of parallel stripe electrodes 2 at four electrodes per a millimeter. The etchant used is of HF—$HNO_3$—$CH_3COOH$ group. The etching can be done in any other known process, such as a dry process through the use of reaction type ion etching using $CF_4$. After the stripes are formed, i-type layer 3-2 having a thickness of about 1 micrometer is formed thereon, and thereafter, n-type amorphous silicon layer 3-3 having a thickness of 200 Å is formed, thereby forming PIN diodes serving as photoelectric cells.

The the amorphous silicon layer is formed through the following steps: the p-type layer is formed by a glow discharge of $B_2H_6$ and $SiH_4$ with a volume ratio 1000 ppm, diluted with $H_2$ in a 10%; the i-type layer is formed by a glow discharge of $SiH_4$, diluted with $H_2$ in a 30%; and the n-type layer is formed by a glow discharge of $PH_3$ and $SiH_4$ with a volume ratio 10,000 ppm, diluted with $H_2$. The conditions for performing the the glow discharge are such that: the substrate temperature is 250° C.; gas pressure is 0.5 Torr; and radio frequency (RF) power is 100 watts (80 mW/cm$^2$).

After forming the amorphous silicon layer, transparent electric conductive electrodes 4 made of ITO ($In_2O_3$-$SnO_2$ (5%)) film having about 1000 Å thickness is deposited on the silicon layer by RF sputtering. In order to form the stripe pattern of electrodes 4, a photoresist pattern of stripes extending in parallel to each other, but intercepting, preferably perpendicularly, the aluminum stripe electrodes 2, is formed with a predetermined spacing, such as four stripes per one millimeter. The etching is effected to both ITO film and n-type amorphous silicon layer. Accordingly, a two-dimensional solid state imaging unit is obtained with four hundred X electrodes and five hundred twenty Y electrodes. As shown in FIG. 3, each X electrode is connected to drive circuit 7 and each Y electrode is connected to drive circuit 8.

Figure 8:
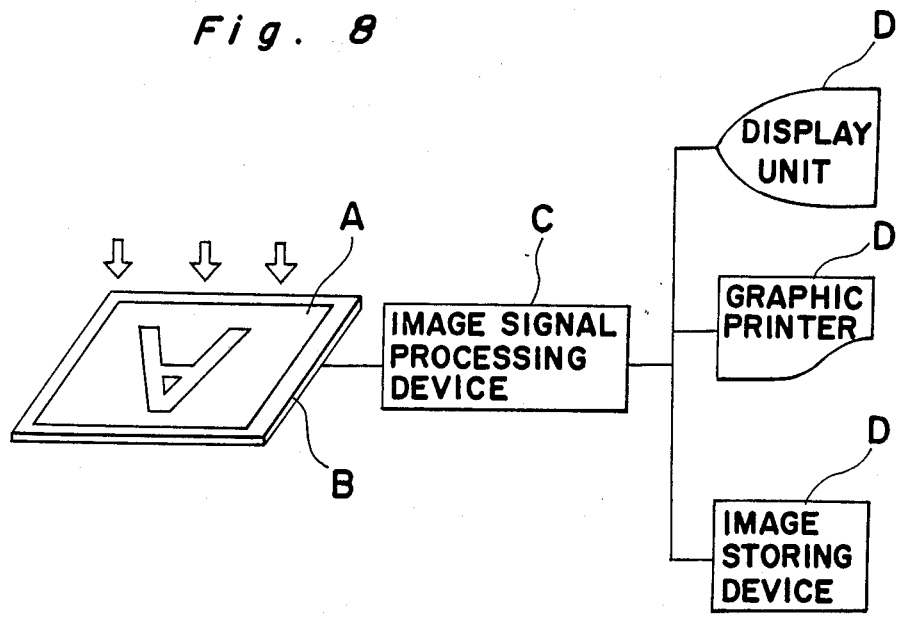
FIG. 8 is a diagrammatic view showing a system in which the two-dimensional solid state image reading unit is connected to various machines.

Using the above-described two-dimensional solid state image reading unit B in a system such as shown in FIG. 8, an image reading test was carried out. A semitransparent document A was placed directly on the image reading unit B with a suitable light illuminated from the top, as indicated by arrows in FIG. 8. The signal obtained from the image reading unit B is transmitted to an image signal processing device C and further to a various indication means D, such as a display unit, graphic printer and image storing device.

EMBODIMENT 2

The two-dimensional solid state image reading unit in this embodiment has an arrangement opposite to that described in Embodiment 1. More specifically, an ITO film of about 900 Å thick is first deposited on the Pyrex glass substrate by RF sputtering. Then, by the plasma CVD method, a p-type amorphous silicon film of about 80 Å thick is deposited. These films are etched together in the same manner described above so as to form a plurality of parallel stripe electrodes aligned and spaced at four stripes per one millimeter. Then, i-type amorphous silicon film of about 3 micrometers thick and n-type amorphous silicon film of about 3000 Å thick are formed on the stripe electrodes through the step of a glow discharge decomposition technique using certain reactive gases. Thereafter, an aluminum film of about 2000 Å thick is evaporated on the n-type film by a sputtering method. Then, the aluminum film is etched together with the n-type film to form a plurality of parallel stripe electrodes in the arranged to intercept with the first-mentioned parallel stripe electrodes. The conditions and the steps to form the amorphous silicon layer is very similar to that described above in Embodiment 1.

When the above-described two-dimensional solid state image reading unit is connected with drive circuits in a manner shown in FIG. 3 and when it is employed in a system such as shown in FIG. 8, the image of the document is displayed immediately on the display unit.

EMBODIMENT 3

This embodiment shows an arrangement wherein blocking diodes or thin film transistors are employed.

Figure 9:
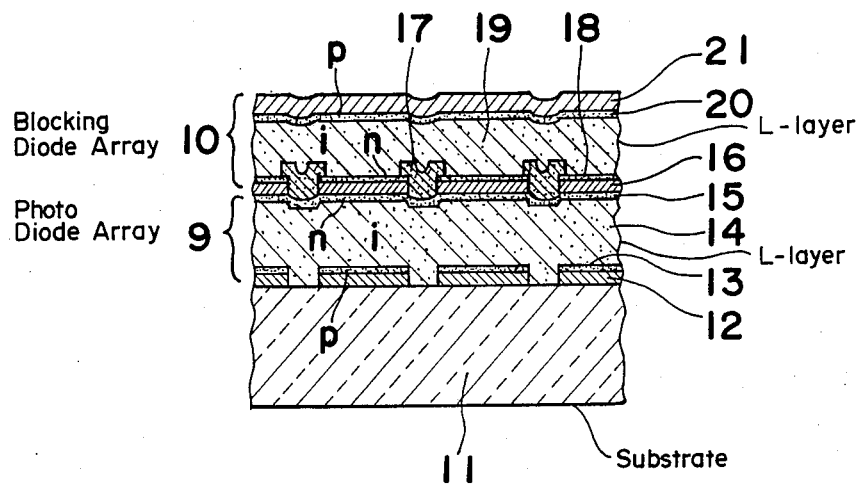
Figure 10:
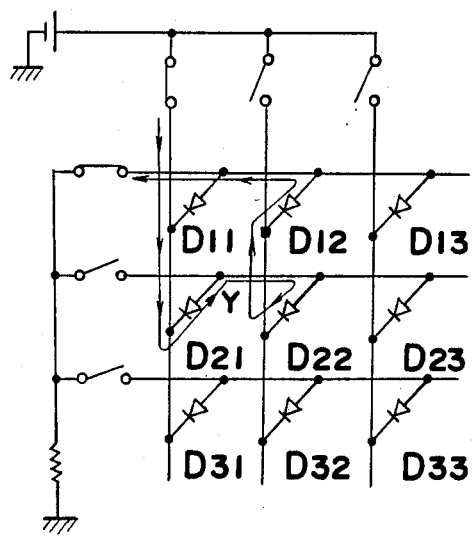
FIGS. 10 and 11 are circuit diagrams showing an operation to drive each photoelectric cell.
Figure 11:
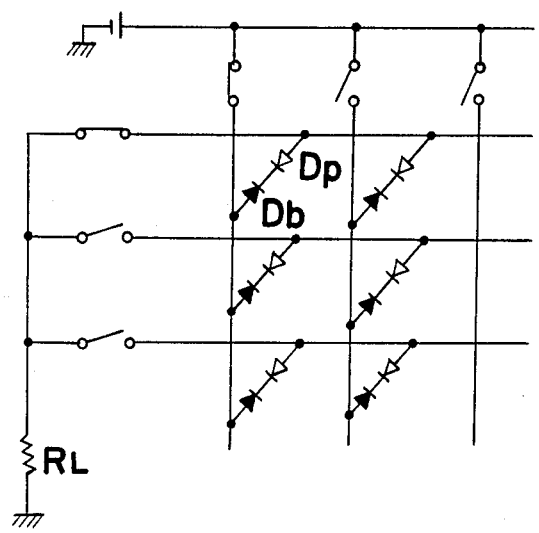

Referring to FIG. 9, a cross sectional view of a two-dimensional solid state image reading unit according to this embodiment is shown. The arrangement shown essentially comprises a photodiode array region 9 at which the light is sensed, and a blocking diode array region 10 which prevents the flow of cross-talk current. FIG. 10 shows a circuit diagram in which no blocking diode is employed. In such a case, there is a possibility that unwanted current may flow through the photodiodes surrounding picture element $D_{11}$ along a current path Y. FIG. 11 shows a circuit diagram of the two-dimensional solid state image reading unit according to this embodiment in which each photodiode $D_p$ is coupled with a blocking diode $D_b$ in a reverse connection. When photodiode $D_p$ receives a light, the charge generated from photodiode $D_p$ serves to reverse bias blocking diode $D_b$, thereby suppressing and minimizing the cross-talk current.

Next, the steps to manufacture the two-dimensional solid state image reading unit according to this embodiment will be described.

The photodiode array region 9 is formed on substrate 11 through the same steps described above in the first embodiment. In this embodiment, transparent ITO electrode 12 has a thickness of 1500 Å, p-type layer 13 100 Å, i-type layer 14 1 micrometer, and n-type layer 15 300 Å. Mounted on photodiode array 9 is blocking diode array 10. First, a light-shielding electrode 16 is deposited by sputtering process on a boundary plane so as to block the light rays from being injected into blocking diode array 10. Then, n-type amorphous silicon layer 18 is formed thereon. These two layers are etched together to form a plurality of parallel stripes at a rate of four stripes per 1 millimeter in the same and coinciding pattern with the parallel stripe electrodes in the photodiode array 9. The stripe electrodes are electrically insulated from each other by an insulation material 17, such as $Si_3N_4$, provided between the stripes through a plasma CVD process. The insulation material 17 is formed in stripes having a contact pattern, which is the same as that of the stripe electrodes. Then, i-type and p-type amorphous silicon layers 19 and 20 are deposited. The thickness of these layers and the conditions for forming these layers are the same as those for the photodiode array. Finally, an aluminum layer is deposited by sputtering, which is etched together with an n-type layer to form a plurality of stripe electrodes 21 which perpendicularly intercept with the transparent stripe electrodes 12. Since the blocking diode array is provided to eliminate or suppress the cross-talk, a high rectification ratio is required. According to the blocking diode of Embodiment 3, the rectification ratio of as high as $10^{10}$ or more at 2 volts bias was observed.

When the two-dimensional solid state image reading unit according to this embodiment is connected with the driving circuits and assembled in the system shown in FIG. 8, one frame was read out in about one second using clock pulses of 200 KHz. The S/N ratio was more than 20 dB under 100 lux exposure with an accumulation time being about 3 milliseconds.

According to the present invention, by using the two-dimensional solid state image reading unit, a direct image reading device having a relatively simple construction can be formed. Furthermore, by employing an amorphous silicon having high sensitivity and high response to light in the photoelectric cell, a ultra-high speed image reading device, which is very difficult to form with the one-dimensional solid state image reading unit, can be realized. Moreover, since the document sheet can be directly placed on the imaging unit, no adjustment of optical path is necessary. And, since the two-dimensional solid state image reading unit has a relatively large size such as similar to the document, high resolution of photolithography is not necessary to manufacture the image reading unit. For example, the photoelectric cells, as well as the electrodes for the external electric connection can be formed in a relatively large size.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. A two-dimensional image reading unit comprising:
   a two-dimensional array of photosensitive semiconductor elements having first and second faces, said photosensitive semiconductor elements being formed in a first semiconductor layer of amorphous silicon having a PIN structure including,
   a p-type layer,
   an n-type layer, and
   an i-type layer disposed between said p-type layer and n-type layer;
   a plurality of first electrodes aligned in parallel to each other and being provided on the first face of said two dimensional array of photosensitive semiconductor elements, each said photosensitive semiconductor element being covered by and electrically connected to a said first electrode, said first electrodes being made of a transparent material; and
   a plurality of second electrodes aligned in parallel to each other and orthogonal to said first electrodes and being provided on said second face of said two-dimensional array of photosensitive semiconductor elements, each said photosensitive semiconductor element being covered by and electrically connected to a said second electrode.

2. A two-dimensional image reading unit comprising:
a two-dimensional array of photosensitive semiconductor elements having first and second faces, said photosensitive semiconductor elements being formed in a first semiconductor layer of amorphous silicon having a PIN structure including,
a p-type layer,
an n-type layer, and
an i-type layer disposed between said p-type layer and n-type layer;
a plurality of firt electrodes aligned in parallel to each other and being provided on the first face of said two dimensional array of photosensitive semiconductor elements, each said photosensitive semiconductor element being covered by and electrically connected to a said first electrode, said first electrodes being made of a transparent material;
a plurality of second electrodes aligned in parallel to each other and orthogonal to said first electrodes and being provided on said second face of said two-dimensional array of photosensitive semiconductor elements, each said photosensitive semiconductor element being covered by and electrically connected to a said second electrode;
a first driving circuit connected to said first electrodes;
a second driving circuit connected to said second electrodes;
at least one of said first and second driving circuits producing a train of signals representing an image of said document when placed on said first face of said semiconductor layer provided with said first electrodes.

3. A two-dimensional image reading unit as claimed in claim 1, wherein a said photoelectric element is defined at each crossing point of said first and second electrodes, each said photoelectric element being reverse biased and generating a current relative to the intensity of light impinging on said photoelectric element.

4. A two-dimensional image reading unit as claimed in claim 1, wherein said p-type layer is divided into parallel stripes in the same pattern as the pattern of said parallel electrodes provided on said p-type layer, and wherein n-type layer is divided into parallel stripes in the same pattern as the pattern of said parallel electrodes provided on said n-type layer.

5. A two-dimensional image reading unit as claimed in claim 1, wherein said n-type layer has a volume resistivity less than $10^6$ ohm-centimeters, and each of i-type and p-type layers has a volume resistivity greater than $10^7$ ohm-centimeters, and wherein said n-type layer is divided into parallel stripes in the same pattern as the pattern of said parallel electrodes provided on said n-type layer.

6. A two-dimensional image reading unit as claimed in claim 1, wherein said n-type layer has a thickness greater than 50 Å and less than 1000 Å, and i-type layer has a thickness greater than 0.5 micrometer and less than 5 micrometers.

7. A two-dimensional image reading unit as claimed in claim 1, wherein said p-type layer has a thickness greater than 50 Å and less than 1000 Å, and i-type layer has a thickness greater than 0.5 micrometer and less than 5 micrometers.

8. A two-dimensional image reading unit as claimed in claim 1, further comprising a plurality of blocking diodes formed in a second semiconductor layer laminated with a light shielding film inserted between said one semiconductor layer and said first electrodes.

* * * * *